(12) United States Patent
Aoki et al.

(10) Patent No.: US 6,275,128 B1
(45) Date of Patent: *Aug. 14, 2001

(54) MRI MAGNETIC FIELD GENERATOR

(75) Inventors: Masaaki Aoki, Takatsuki; Shigeo Hashimoto, Saga, both of (JP)

(73) Assignee: Sumitomo Special Metals Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/380,129

(22) PCT Filed: Dec. 26, 1997

(86) PCT No.: PCT/JP97/04867

§ 371 Date: Sep. 21, 1999

§ 102(e) Date: Sep. 21, 1999

(87) PCT Pub. No.: WO99/33397

PCT Pub. Date: Jul. 8, 1999

(51) Int. Cl.[7] ........................................................ H01F 5/00
(52) U.S. Cl. ............................................ 335/299; 324/319
(58) Field of Search ................................. 335/216, 296, 335/299, 297, 298, 302; 324/318–321; 508/844

(56) References Cited

U.S. PATENT DOCUMENTS 5,061,897 * 10/1991 Danby et al. ...................... 324/318
5,304,934 * 4/1994 Laskaris et al. ................... 324/318
5,431,165 * 7/1995 Sellers .............................. 128/653.5
5,439,543 * 8/1995 Dorri et al. ....................... 156/184
5,555,251 * 9/1996 Kinanen ............................ 324/319
5,627,471 * 5/1997 Kinanen ............................ 324/319
5,825,187 * 10/1998 Ohashi et al. ..................... 324/319
5,923,235 * 7/1999 Van Oort et al. .................. 335/301

FOREIGN PATENT DOCUMENTS 62295405  12/1987  (JP) .
1164356   6/1989   (JP) .
3131234   6/1991   (JP) .
454938    2/1992   (JP) .
9566920   3/1997   (JP) .

* cited by examiner

*Primary Examiner*—Lincoln Donovan
(74) *Attorney, Agent, or Firm*—Dykema Gossett PLLC

(57) ABSTRACT

An object of the present invention is to provide an MRI magnetic field generator with which the magnetic field uniformity within the imaging field of view of the air gap can be adjusted easily and safely, without having to detach the gradient coils, after the MRI magnetic field generator has been installed with gradient coils already mounted on a pair of magnetic pole pieces. After the holder disk 13 has been placed on and fastened to the base disk 11, the magnetic material pellets or permanent magnet pellets for adjusting the magnetic field uniformity are inserted into the required pits disposed in a specific pattern, and if needed, spacers are placed in the gaps between [the pellets] and the cover disk 14 to position everything, after which the cover disk 14 is screwed on to hold everything together. The resulting shim holder 10 is aligned with and fastened to the gradient coil 6 or its support member.

11 Claims, 2 Drawing Sheets

MRI MAGNETIC FIELD GENERATOR

TECHNICAL FIELD

This invention relates to an improvement to a magnetic field generator used, for example, in medical-use magnetic resonance imaging devices (hereinafter referred to as MRI devices), and more particularly to an MRI magnetic field generator with which, when gradient coils have been mounted on a pair of magnetic pole pieces facing each other so as to form an air gap and the magnetic field is altered by the effect of the environment where this magnetic field generator has been installed, for example, the magnetic field uniformity within the imaging field of view in the air gap can be easily adjusted without the gradient coils having to be detached.

BACKGROUND ART

An MRI device is a device with which all or part of a patient's body is inserted into the air gap of a magnetic field generator that forms a powerful magnetic field, and a tomographic image is obtained so that the tissue thereof can be evaluated.

This MRI magnetic field generator has to be wide enough for all or part of a patient's body to be inserted, and to obtain a sharp tomographic image it is usually necessary to form a stable, powerful, uniform magnetic field having a precision of $1 \times 10^{-4}$ or less and 0.02 to 2.0 T within the imaging field of view in the air gap.

One known magnetic field generator used in MRI devices has a structure in which magnetic pole pieces are fixed facing each other at one end of each of a pair of permanent magnet structures in which an R—Fe—B-based magnet is used as the magnetic field generation source, the other ends are coupled by a yoke, and a static magnetic field is generated within an air gap between the magnetic pole pieces (Japanese Patent Publication 2-23010).

Another known structure has electromagnetic coils (including normal conduction coils, superconduction coils, and so on) wound around iron cores for the magnetic field generation source in place of the above-mentioned permanent magnet structures (Japanese Laid-Open Patent Application 4-288137), and the same magnetic pole pieces as those mentioned above are also employed in this structure.

As mentioned above, the uniformity of the magnetic field of a magnetic field generator needs to have a precision of $1 \times 10^{-4}$ or less within the specified space, but this is greatly affected by the shape of the magnetic pole pieces, particularly in the magnetic circuit, and is also affected by the shape of the yokes, where the device is installed, and other such factors, making it inevitable that various adjustments will need to be made in order to bring the magnetic field uniformity within the imaging field of view to the specified value. Therefore, a structure had to provide a magnetic field of extremely high uniformity and allow the magnetic field intensity within the required air gap to be locally increased or decreased by the required amount without the magnetic pole pieces being re-machined.

In view of this, the applicant, assuming the imaging space to be a sphere, proposed that the magnetic field intensity within the air gap could be locally increased or decreased by the required amount and the magnetic field uniformity thereby increased without the magnetic pole pieces having to be re-machined if magnetic material pellets[1] and/or permanent magnet pellets were disposed at specific locations on the sides of the magnetic pole pieces facing the air gap according to the magnetic field intensity at various circumferences measured by traversing this spherical space in a plurality of horizontal planes (Japanese Patent Publication 5-87962).

To obtain position data within the air gap with an MRI device, gradient coils (GC) consisting of a set of three coils corresponding to the X, Y, and Z directions are usually disposed in the vicinity of the magnetic pole pieces, and a gradient field can be generated in the desired direction within the air gap by applying a pulse current to these gradient coils. In other words, position data is given to the nuclear magnetic resonance signal by adding a gradient field to the uniform magnetic field formed within the air gap, and a large number of pulsed gradient fields must be added in order to obtain a single image.

Meanwhile, when the magnetic field is altered by the effect of the environment where this magnetic field generator has been installed, for example, or when the MRI device has already been installed at its usage site, once the gradient coils have been installed on the magnetic pole pieces, adjusting the magnetic field uniformity by placing and moving the magnetic material pellets and/or permanent magnet pellets as discussed above is difficult and complicated work, and this work cannot be completed in a short time.

Japanese Laid-Open Patent Application 1-164356 proposes a method for arranging field adjusting permanent magnet pellets for the purpose of adjusting the magnetic field uniformity, wherein a plurality of field adjusting permanent magnet pellets are fixed by screws to a support plate via pedestal, and this support plate is bolted to an annular protrusion on the magnetic pole pieces with the permanent magnet pellets on the magnetic pole piece side, or [the permanent magnet pellets] are disposed with respect to the air gap from the outer peripheral side of the pair of magnetic pole pieces. The problem with this structure is that removing the shims takes a very long time because the permanent magnet pellets are fixed by screws to the support plate via a pedestal.

Specifically, magnetic material pellets or permanent magnet pellets that are used for adjusting the magnetic field uniformity are not all of the same size and shape. First, a selection is made between a magnetic material and a permanent magnet according to the amount of adjustment or the position of the space for adjustment, and then the shape and size thereof are suitably selected, so a pedestal must be fabricated according to the size and shape of the magnetic material for [the magnetic material] to be fixed by screws to the support plate via the pedestal, and a pedestal of the required shape must be fabricated according to the size and shape of the permanent magnet pellets so that the magnetization thereof will face in the proper direction, so removal of the shims entails a tremendous amount of work including pedestal fabrication.

SUMMARY OF THE INVENTION

An object of this invention is to provide an MRI magnetic field generator with which the magnetic field uniformity within the imaging field of view of the air gap can be adjusted easily and safely, without having to detach the gradient coils, after the MRI magnetic field generator has been installed with gradient coils already mounted on a pair of magnetic pole pieces.

As a result of various investigations aimed at finding a structure of a magnetic field generator with which the magnetic field uniformity within the imaging field of view of the air gap could be adjusted easily and effectively without having to detach the gradient coils, the inventors perfected the present invention upon discovering that by using shim holders including a main body provided with pits capable of holding magnetic pellets, and a cover that is detachable toward the air gap side, the objective of installing magnetic material pellets or permanent magnet pellets of various sizes, shapes, and directions of magnetization can be achieved merely by putting these pellets in the pits of the main body and covering them, with spacers interposed if needed.

This invention is an MRI magnetic field generator having a pair of magnetic pole pieces that face each other so as to form an air gap and generating a magnetic field in the air gap, this MRI magnetic field generator including shim holders composed of a non-magnetic material and provided to the air gap-facing sides of gradient coils installed facing the magnetic pole pieces, the shim holders each including a main body provided with pits capable of holding magnetic pellets, and a cover that is detachable toward the air gap side.

BEST MODE FOR CARRYING OUT THE INVENTION

A structural example of the MRI magnetic field generator pertaining to this invention will now be described in detail on the basis of the figures.

Figure 1:
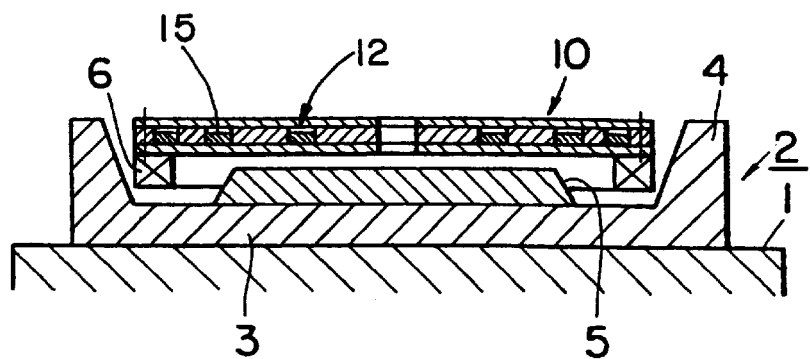
FIG. 1 is a vertical cross section illustrating an embodiment of the magnetic pole pieces of the magnetic field generator pertaining to this invention.

The magnetic pole piece 2 in FIG. 1 is the lower magnetic pole piece out of a pair disposed facing one another above and below. This rests on a magnet structure 1 which serves as a magnetic field generation source, such as an R—Fe—B-based magnet or an electromagnetic coil. The magnetic pole piece 2 has an annular protrusion 4 made of pure iron disposed around the outer periphery of a base 3 composed of iron or soft iron. The middle portion is composed of iron, soft iron, a laminated silicon steel sheet, or soft ferrite. A flat convex protrusion 5 is also provided.

Figure 2:
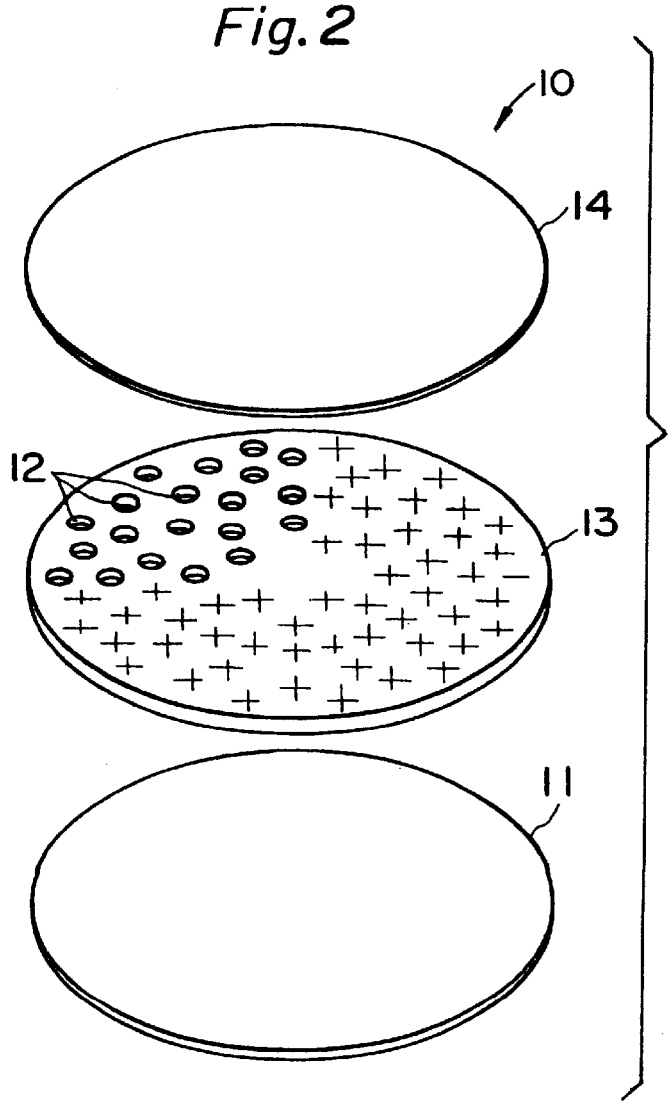
FIG. 2 is an exploded oblique view of the shim holder pertaining to this invention.

In FIG. 1, 6 is a gradient coil, which is provided at the required position within the magnetic pole piece 2 on a support member (not shown). A shim holder 10 is provided to this gradient coil 6 or its support member so as to be fastened thereto. The shim holder 10 consists of a three-layer, non-magnetic, thin disk, as shown in FIG. 2, and has a layered structure including a base disk 11, a holder disk 13 in which have been made holes 12 that serve as pits for accommodating the magnetic pellets 15, and a cover disk 14. The holes 12 that hold the magnetic pellets are made in the holder disk 13 in a circle or in concentric circles so that the magnetic pellets will be arranged according to various positions on several circumferences for each of a plurality of sliced horizontal planes of a spherical space imagined in the center of the air gap.

The shim holder 10 is structured such that the various disks are suitably disposed and screwed in place. After the holder disk 13 has been placed on and fastened to the base disk 11, the magnetic material pellets or permanent magnet pellets for adjusting the magnetic field uniformity are inserted into the required pits disposed in a specific pattern, and if needed, spacers are placed in the gaps between the pellets and the cover disk 14 to position everything, after which the cover disk 14 is screwed on to hold everything together. The resulting shim holder 10 is aligned with and fastened to the gradient coil 6 or its support member.

With this invention, a vinyl chloride resin, glass fiber reinforced plastic, or another such non-magnetic material can be used for the shim holder 10, and in addition to the three-layer structure of FIG. 2, the shim holder 10 may have a two-layer structure including a main body provided with pits, and a cover.

Also, with this invention, the magnetic field generator is not limited to the above embodiment, and as long as it is structured such that the pair of magnetic poles which face each other to form an air gap are magnetically coupled by a yoke and a magnetic field is generated in this air gap, any kind of structure can be employed. Furthermore, the size and shape of the yokes used to form a magnetic path may be suitably selected as dictated by the required size of the air gap, the magnetic field intensity, the magnetic field uniformity, and various other variables.

Figure 3A:
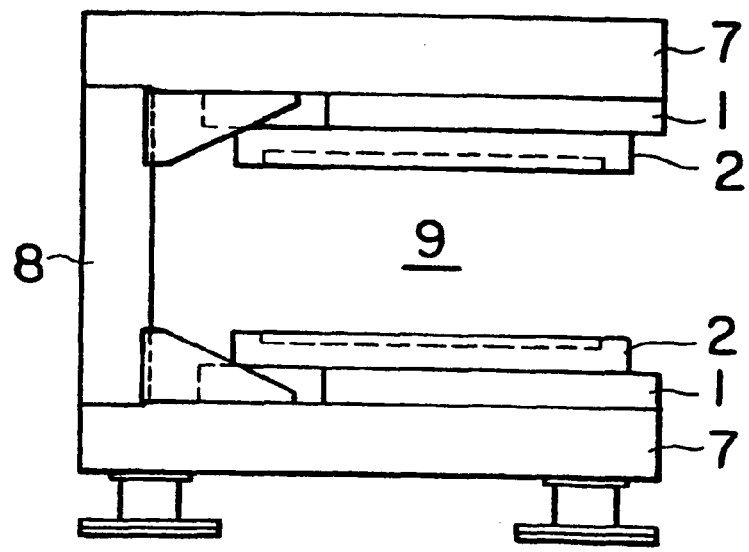
FIG. 3 is diagrams illustrating structural examples of the magnetic field generator, with A being a front view and B a horizontal lateral cross section of A.
Figure 3B:
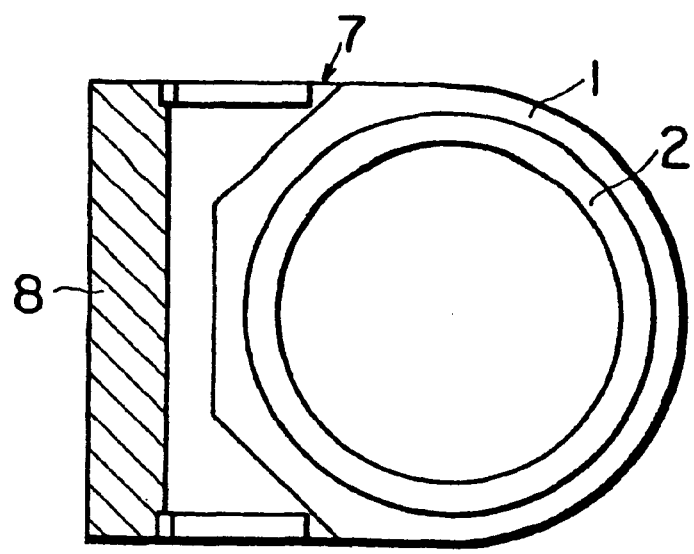

For instance, as shown in FIGS. 3A and 3B, a structure can be employed in which magnetic pole pieces 2 are fastened facing each other at one end of each of a pair of permanent magnet structures 1 in which an R—Fe—B-based magnet is used as the magnetic field generation source, yokes 7 fastened to the other ends are coupled by a flat connecting yoke 8, and a static magnetic field is generated within the air gap 9 between the magnetic pole pieces 2.

With the structure in FIGS. 3A and 3B, the yokes 7 are connected at one end by a single connecting yoke 8, and since the air gap 9 between the magnetic pole pieces 2 is open on three sides (closed only on the connecting yoke 8 side), the device has a more open feel, without confining the patient.

In addition to the single-plate structure illustrated in FIGS. 3A and 3B, the connecting yoke in this magnetic field generator can also have any of a variety of other configurations, such as a structure including two plates or columns, a structure including four columns, or a structure in which the magnet structures or magnetic material pellets are disposed on upper and lower opposing surfaces inside a cylindrical yoke.

Normal conduction magnets, superconduction magnets, permanent magnets, and the like can be used as the magnet structures that serve as the magnetic field generation source, and when permanent magnets are employed, ferrite magnets, rare earth cobalt-based magnets, or other such known magnetic materials can be used. In particular, the device can be made much more compact by using light rare earths, which are a plentiful resource, with R primarily being Nd or Pr, and using an Fe—B—R-based permanent magnet that exhibits an extremely high energy product of over 30 MGOe as the main component. Also, by arranging a combination of these known permanent magnets, a magnetic field generator that is less expensive can be provided without greatly hindering efforts to make the device more compact.

EMBODIMENT

A shim holder with the three-layer structure shown in FIG. 2 was fabricated using a vinyl chloride resin for the material, whereupon the product was easy to handle and lightweight, weighing only about 11 kg at a diameter of about 900 mm and a thickness of about 15 mm, and could be detached with the gradient coil still mounted. The use of this shim holder allowed magnetic field adjustment to be performed using the linear programming method at the site where the MRI magnetic field generator was actually used, the magnetic field adjustment did not require much labor, and the adjustment could be completed in a shorter time than any other conventional method.

INDUSTRIAL APPLICABILITY

With the shim holder pertaining to the present invention, after an MRI magnetic field generator has been installed with gradient coils already mounted on a pair of magnetic material pellets, magnetic field adjustment can be carried out using a method such as linear programming at the site where the MRI magnetic field generator is actually used, without having to detach the gradient coils, and furthermore it is possible to adjust the magnetic field uniformity within the imaging field of view of the air gap easily and safely.

What is claimed is:

1. An MRI magnetic field generator which comprises:

first and second spaced magnetic structures having respective first and second ends that face one another and define an air gap therebetween, first and second pole pieces respectively positioned on said first and second ends of said first and second magnetic structures, first and second shim holders positioned between said first and second pole pieces, said first shim holder being positioned adjacent said first pole piece and including a first disk holder having a plurality of pits therein arranged in concentric circles and a first cover disk detachably connected to said first disk holder for covering said pits, and said second shim holder being positioned adjacent said second pole piece and including a second disk holder having pits therein arranged in concentric circles and a second cover disk detachably connected to said second disk holder for covering said pits, first and second gradient coils respectively positioned between said first shim holder and said first pole piece and said second shim holder and said second pole piece, and a plurality of magnetic pellets removably positionable in at least some of said pits of said first and second disk holders prior to positioning of said respective first and second shim holders between said first and second pole pieces and prior to attachment of said cover disks to said disk holders in order to adjust magnetic field intensity in said air gap.

2. The MRI magnetic field generator according to claim 1, wherein said first and second shim holders are composed of vinyl chloride or glass fiber-reinforced plastic.

3. The MRI magnetic field generator according to claim 1, wherein said first and second shim holders are directly fastened to the respective first and second gradient coils.

4. The MRI magnetic field generator according to claim 1, wherein said first and second shim holders are fastened to said respective first and second gradient coils via a respective support member.

5. An MRI magnetic field generator as defined in claim 1, wherein said pits in each of said first and second disk holders extends therethrough.

6. An MRI magnetic field generator as defined in claim 1, wherein said pits in each of said first and second disk holders are substantially coplanar with one another.

7. The MRI magnetic field generator according to claim 1 wherein said magnetic pellet is a pellet selected from the group of a pellet consisting of a magnetic material pellet and a permanent magnet pellet.

8. An MRI magnetic field generator according to claim 1, including first and second yokes which support said first and second magnetic structures, and including a connecting yoke which connects said first and second yokes.

9. An MRI magnetic field generator according to claim 1 further comprising a tubular yoke, said first and second magnetic pole pieces both provided on said tubular yoke and disposed in opposing spaced relation to each other therewithin, whereby said tubular yoke serves to magnetically couple said first and second pole pieces to one another.

10. An MRI magnetic field generator according to claim 1 wherein said shim holder comprises non-magnetic material.

11. AN MRI magnetic field generator according to claim 1, wherein said first shim holder includes a first base disk located on a side of said first disk holder opposite said first disk cover such that said first disk holder is between said first base disk and said first disk cover, and said second shim holder includes a second base disk located on a side of said second disk holder opposite said second disk cover such that said second disk holder is between said second base disk and said second disk cover.

* * * * *